United States Patent
Kawamura et al.

(10) Patent No.: US 7,833,370 B2
(45) Date of Patent: *Nov. 16, 2010

(54) METHOD FOR MANUFACTURING A CERAMIC MULTI-LAYERED SUBSTRATE

(75) Inventors: Akiyoshi Kawamura, Nagaokakyo (JP); Takayuki Tsukizawa, Kusatsu (JP); Tetsuya Ikeda, Kyoto (JP); Osamu Chikagawa, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 193 days.

This patent is subject to a terminal disclaimer.

(21) Appl. No.: 11/951,842

(22) Filed: Dec. 6, 2007

(65) Prior Publication Data

US 2008/0142147 A1    Jun. 19, 2008

Related U.S. Application Data

(63) Continuation of application No. PCT/JP2007/061415, filed on Jun. 6, 2007.

(30) Foreign Application Priority Data

Aug. 7, 2006   (JP)   .............................. 2006-215046
Mar. 13, 2007  (JP)   .............................. 2007-064173

(51) Int. Cl.
    *C03B 29/00*   (2006.01)
(52) U.S. Cl. .................................................. 156/89.11
(58) Field of Classification Search ................ 156/89.11
     See application file for complete search history.

(56) References Cited

U.S. PATENT DOCUMENTS 4,030,004 A  *  6/1977  Rutt ............................ 361/313
4,353,957 A  * 10/1982  Rutt et al. .................... 428/110
5,144,527 A  *  9/1992  Amano et al. ............. 361/321.2
6,252,761 B1 *  6/2001  Branchevsky ............ 361/321.2
6,938,332 B2 *  9/2005  Harada et al. ................. 29/830

(Continued)

FOREIGN PATENT DOCUMENTS

EP          2 023 701 A1    2/2009

(Continued)

OTHER PUBLICATIONS

English translation of JP 2005-277008 A.*

(Continued)

*Primary Examiner*—Mark A Osele
*Assistant Examiner*—Nickolas Harm
(74) *Attorney, Agent, or Firm*—Keating & Bennett, LLP

(57) ABSTRACT

A method for manufacturing a ceramic multi-layered substrate includes a first step of forming a green ceramic laminate including a plurality of stacked green ceramic base layers, a second step of firing the green ceramic laminate to sinter the green ceramic layers, and a third step of separating the sintered ceramic laminate formed by firing the green ceramic laminate into a ceramic multi-layered substrate. The green ceramic base layers stacked in the first step include a separation pattern formed along separation lines, the separation pattern disappearing during firing. In the third step, the sintered ceramic laminate is separated into a plurality of ceramic multi-layered substrates separated through a cavity formed by the disappearance of the separation pattern during the firing in the second step.

14 Claims, 8 Drawing Sheets

U.S. PATENT DOCUMENTS

| | | | |
|---|---|---|---|
| 2005/0230028 A1* | 10/2005 | Iwase et al. | 156/89.11 |
| 2006/0234021 A1 | 10/2006 | Tanei et al. | |
| 2008/0135155 A1* | 6/2008 | Kawamura et al. | 156/89.11 |

FOREIGN PATENT DOCUMENTS

| | | |
|---|---|---|
| JP | 62-52917 A | 3/1987 |
| JP | 04-038071 U | 3/1992 |
| JP | 05-075262 A | 3/1993 |
| JP | 2001-332857 A | 11/2001 |
| JP | 2002-270459 A | 9/2002 |
| JP | 2002-290043 A | 10/2002 |
| JP | 2005-150669 A | 6/2005 |
| JP | 2005-277008 A | 10/2005 |
| JP | 2005-311225 A | 11/2005 |

OTHER PUBLICATIONS

Official communication issued in counterpart International Application No. PCT/JP2007/061415, mailed on Sep. 11, 2007.

Official Communication issued in counterpart European Application No. 07744760.5, mailed on Oct. 22, 2009.

Official Communication issued in corresponding Japanese Patent Application No. 2007-556187, mailed on Aug. 10, 2010.

Official Communication issued in corresponding Korean Patent Application No. 10-2008-7004158, mailed on Jun. 28, 2010.

* cited by examiner

METHOD FOR MANUFACTURING A CERAMIC MULTI-LAYERED SUBSTRATE

BACKGROUND OF THE INVENTION

1. Field of the Invention

The present invention relates to a method for manufacturing a ceramic multi-layered substrate. In particular, the present invention relates to a method for manufacturing a ceramic multi-layered substrate including a plurality of stacked ceramic layers.

2. Description of the Related Art

Ceramic multi-layered substrates including a plurality of stacked ceramic layers can be efficiently produced by simultaneously firing a source substrate including a plurality of ceramic multi-layered substrates and cutting the source substrate into individual ceramic multi-layered substrates after firing.

For example, Japanese Unexamined Utility Model Registration Application Publication No. 4-38071 discloses that ceramic green sheets having dividing lines are transferred and laminated to form a laminate, dividing grooves are formed by, for example, irradiating the dividing lines with a $CO_2$ laser after the laminate is subjected to heat treatment, and the laminate is separated into many substrates.

Japanese Unexamined Patent Application Publication No. 5-75262 discloses that dividing grooves are formed in advance in either or both of front and back surfaces of press-bonded ceramic green sheets, and the substrate is bent to form cracks along the dividing grooves after heat treatment, thereby separating the substrate into many substrates.

Japanese Unexamined Patent Application Publication No. 2001-332857 discloses a ceramic substrate having cavities therein that is formed by laminating ceramic green sheets having depressions formed by performing pressing partway into the sheets.

Japanese Unexamined Patent Application Publication No. 2005-311225 discloses that ceramic green sheets each having a shape corresponding to the outer shape of a laminated electronic component are laminated, removable material layers are laminated at locations corresponding to cutting margins, and the removable material layers are removed after firing, thereby separating the laminate into individual laminated electronic components.

In Japanese Unexamined Utility Model Registration Application Publication No. 4-38071, however, an expensive, large-scale $CO_2$ laser irradiation apparatus is required. The laser irradiation requires a long time. During cutting, the substrates may be broken by thermal stress, and deformation and/or alteration due to the heat of the laser may occur at and around sections of the substrate.

In the method disclosed in Japanese Unexamined Patent Application Publication No. 5-75262, failures, such as deformation and breakage, may occur in the press-bonded sheets during conveyance due to the dividing grooves. When the heat-treated substrate is bent, the substrate may be broken at undesired locations other than the grooves, which results in defective articles. Although the substrate is separated along the dividing grooves, sections may have irregular shapes, which results in out-of-specification products.

In the method disclosed in Japanese Unexamined Patent Application Publication No. 2001-332857, the cavities may collapse or be deformed due to the uneven thickness of the ceramic green sheets and uneven pressing force. Thus, it is difficult to accurately form cavities.

In the method disclosed in Japanese Unexamined Patent Application Publication No. 2005-311225, it is necessary to prepare the ceramic green sheets into which the removable material is charged such that the sheets have a shape corresponding to the outside shape of the laminated electronic component, which results in a complicated production process. After firing, the laminate is separated into individual components. For example, to perform a step of mounting surface-mounted components thereon, the individual components must be rearranged.

SUMMARY OF THE INVENTION

To overcome the problems described above, preferred embodiments of the present invention provide a source substrate for forming ceramic multi-layered substrates and a method for accurately and easily manufacturing a ceramic multi-layered substrate.

A method for manufacturing a ceramic multi-layered substrate according to a preferred embodiment of the present invention includes a first step of forming a green ceramic laminate including a plurality of stacked green ceramic base layers, a second step of firing the green ceramic laminate to sinter the green ceramic layers, and a third step of separating the sintered ceramic laminate by firing the green ceramic laminate into one or more ceramic multi-layered substrates. At least one of the green ceramic base layers stacked in the first step includes a separation pattern formed along separation lines defining boundary lines used to separate the laminate into the ceramic multi-layered substrates. The separation pattern disappears during firing in the second step. In the second step, the separation pattern disappears to form a cavity inside the sintered ceramic laminate. In the third step, the sintered ceramic laminate is separated into one or more ceramic multi-layered substrates along the cavity.

According to the above-described method, even when the ceramic base layers are laminated by pressing, the position and shape of the separation pattern are not changed. Thus, the cavity is accurately formed inside the sintered ceramic laminate along the separation lines. After firing, the sintered ceramic laminate is easily separated along the cavity.

Preferably, a shrinkage inhibiting layer for inhibiting firing shrinkage of the green ceramic base layers in the planar direction is provided on a main surface of one of the green ceramic base layers.

In this case, in the ceramic base layers, the firing shrinkage is inhibited in the planar direction, and the amount of shrinkage in the thickness direction is increased. Thus, the distance between cavities formed inside the sintered ceramic laminate is reduced in the stacking direction, which facilitates removal of the ceramic multi-layered substrate. Furthermore, firing stress is reduced by the formation of the cavity.

Preferably, the shrinkage inhibiting layer is composed of a ceramic material that is not substantially sintered during the firing in the second step.

Although the shrinkage inhibiting layer may be composed of a metal powder, the ceramic powder has shrinkage inhibiting properties suitable for the ceramic base layers.

For example, a green ceramic laminate includes the ceramic base layers and the shrinkage inhibiting layer provided therebetween which has a thickness sufficiently less than those of the ceramic base layers. The green ceramic laminate may be fired while the firing shrinkage of the ceramic base layers is suppressed in the planar direction. In this case, glass components in the ceramic base layers penetrate into the shrinkage inhibiting layer. The density of the shrinkage inhibiting layer is increased with the glass components. Therefore, the ceramic multi-layered substrate includes the shrinkage inhibiting layer.

Alternatively, the shrinkage inhibiting layer may be provided on at least one main surface of the green ceramic laminate. In this case, the removal of the shrinkage inhibiting layer after firing results in the ceramic multi-layered substrate.

That is, the shrinkage inhibiting layer provided on the main surface suppresses the firing shrinkage of the ceramic laminate in the planar direction. In this case, the shrinkage inhibiting layer may have a thickness greater than those of the ceramic base layers. The removal of the resulting porous shrinkage inhibiting layer after firing results in the ceramic multi-layered substrate without the shrinkage inhibiting layer.

Preferably, the separation pattern is a resin pattern primarily composed of a resin that disappears during the firing.

Resins have different disappearance behaviors depending on the molecular weight and other properties of the resin. Thus, a suitable material can be selected in response to the disappearance of the binder resin in the ceramic base layers. Furthermore, the formation of combustion residues and the occurrence of delamination are effectively prevented.

Preferably, the separation pattern is composed of a paste including a material powder that disappears when the temperature in the second step reaches approximately the maximum firing temperature.

In this case, in the second step, the separation pattern does not disappear before the temperature reaches approximately the maximum firing temperature of the ceramic layers. Thus, the cavity formed by the disappearance of the separation pattern is not readily reduced in size during firing after the formation of the cavity, as compared to when the cavity is formed while the firing temperature is relatively low. Furthermore, it is possible to form cracks in the ceramic laminate between adjacent cavities, thereby facilitating the formation of the ceramic multi-layered substrate by separation.

Preferably, the material powder is composed of carbon.

Carbon is preferred because it is inexpensive and does not adversely affect the ceramic multi-layered substrate it disappears.

Preferably, at least one end of the separation pattern is exposed at a side surface of the green ceramic laminate.

In this case, the components in the ceramic base layers are eliminated through the cavity formed by the disappearance of the separation pattern. This minimizes residual carbon in the base layers and efficient firing.

Preferably, the green ceramic base layers include a binder resin, and the separation pattern is primarily composed of a resin that disappears at a lower temperature than the binder resin during the firing.

In this case, the components in the ceramic base layers are eliminated through the cavity formed by the disappearance of the separation pattern. This minimizes residual carbon in the base layers and efficient firing.

Preferably, the separation pattern preferably has a lattice configuration so as to define the plurality of ceramic multi-layered substrates.

In this case, a plurality of ceramic multi-layered substrates can be simultaneously produced.

Preferably, one separation pattern segment is arranged between adjacent ceramic multi-layered substrates.

In this case, adjacent ceramic multi-layered substrates are arranged with no space therebetween. Thus, the number of ceramic multi-layered substrates produced from the ceramic laminate can be increased.

Preferably, two or more separation pattern segments are arranged between adjacent ceramic multi-layered substrates.

In this case, adjacent ceramic multi-layered substrates are spaced apart from one another. For example, inspection terminals for inspecting the ceramic multi-layered substrates may be arranged in the spaces between the ceramic laminates.

Preferably, the green ceramic base layers are green low-temperature co-fired ceramic layers primarily composed of a low-temperature co-fired ceramic powder, and the green ceramic laminate includes a conductive pattern primarily composed of gold, silver, or copper.

The phrase "low-temperature co-fired ceramic (LTCC)" material refers to a ceramic material that can be sintered at about 1,050° C. or less and co-fired with Au, Ag, Cu, or other suitable material having a small resistivity. The ceramic material is suitable as a substrate material used in modules and devices for high-frequency applications. Specific examples of the low-temperature co-fired ceramic material include: (1) glass composite LTCC materials including ceramic powders, such as alumina, zirconia, magnesia, and forsterite, and borosilicate glasses; (2) crystallized glass LTCC materials including $ZnO$—$MgO$—$Al_2O_3$—$SiO_2$ crystallized glasses; and (3) non-glass LTCC materials including $BaO$—$Al_2O_3$—$SiO_2$ ceramic powders and $Al_2O_3$—$CaO$—$SiO_2$—$MgO$—$B_2O_3$ ceramic powders. The use of the low-temperature co-fired ceramic material incorporates a passive element, such as a capacitor or an inductor, having a base body of a ceramic sintered body in the sintered ceramic laminate.

Preferably, the method further includes a step of mounting a surface-mounted electronic component on a portion corresponding to the ceramic multi-layered substrate of the sintered ceramic laminate or at least one main surface of the ceramic multi-layered substrate separated from the sintered ceramic laminate.

In this case, a module including a surface-mounted electronic component mounted on the ceramic multi-layered substrate is produced. In particular, mounting the component after firing and before separation eliminates rearrangement of the substrates. Thus, the surface-mounted electronic component can be efficiently mounted.

According to preferred embodiments of the present invention, the sintered laminate is separated along the cavity formed by the disappearance of the separation pattern during firing, thereby producing the ceramic multi-layered substrate accurately and easily.

That is, sections of the sintered ceramic laminate pass through the cavity, thereby eliminating misalignment and variations in shape of the ceramic multi-layered substrate. This also prevents separation at an undesirable location, breakage during cutting, and variations among the sections.

Furthermore, a thick-film pattern may be formed at a desired location of the green ceramic laminate as well as a conductive pattern. The cavity is formed by firing. Thus, the cavity does not cause deformation and breakage during the conveyance of the green ceramic multi-layered substrate. The sintered ceramic laminate can be easily cut by applying a stress to the cavity. An expensive, large-scale $CO_2$ laser irradiation apparatus is not required. The application of heat is not required during cutting, thereby inhibiting the deformation and alteration due to heat at and around the sections.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Preferred embodiments of the present invention will be described below with reference to FIGS. 1 to 18.

First Preferred Embodiment

A method for manufacturing a ceramic multi-layered substrate according to a first preferred embodiment will be described below with reference to FIGS. 1 to 9.

A brief outline of the method for manufacturing a ceramic multi-layered substrate will be described below.

Figure 1:
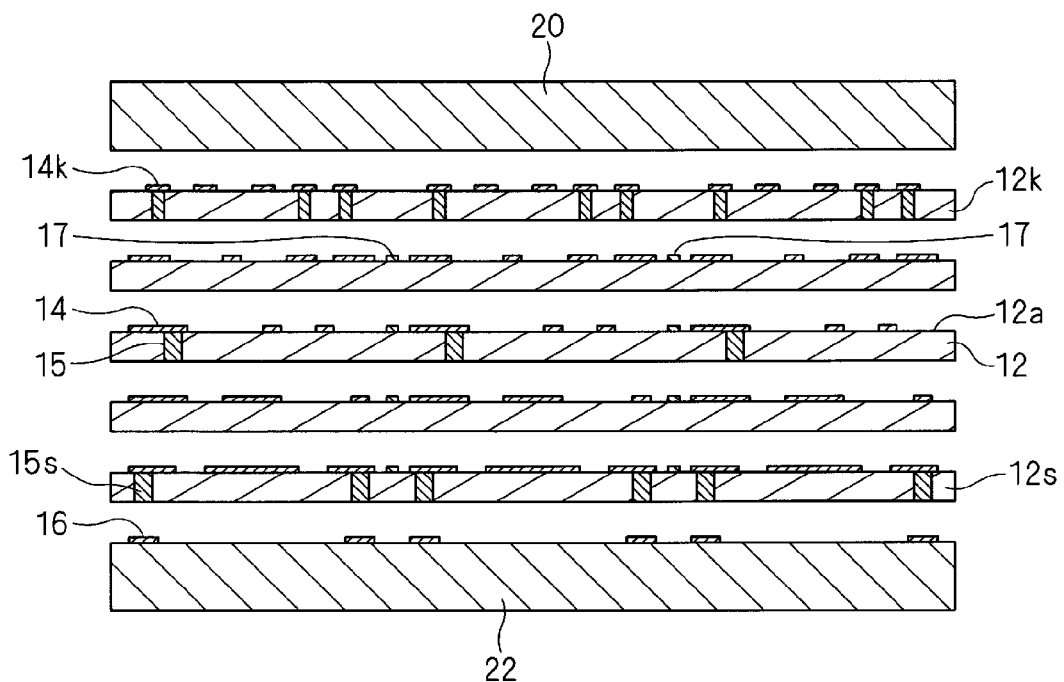
FIG. 1 is a cross-sectional view of a production process of ceramic multi-layered substrates according to a first preferred embodiment of the present invention.
Figure 2:
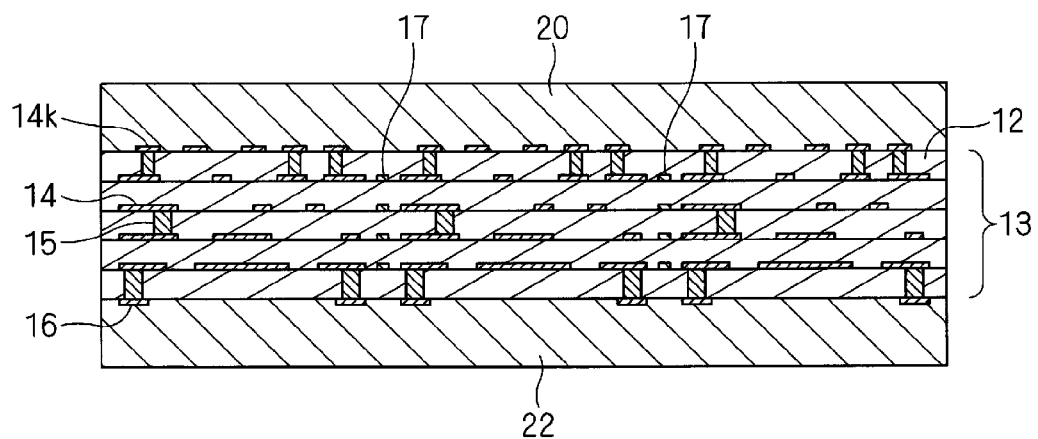
FIG. 2 is a cross-sectional view of a production process of the ceramic multi-layered substrates according to the first preferred embodiment of the present invention.

As shown in FIG. 1, a plurality of ceramic green sheets 12 and shrinkage inhibiting green sheets 20 and 22 are prepared and stacked in a predetermined order to form a composite laminate in which the shrinkage inhibiting green sheets 20 and 22 are in close contact with both surfaces of a green ceramic laminate 12, as shown in FIG. 2.

A green ceramic laminate 13 includes a portion to be formed into a plurality of ceramic multi-layered substrates. The green ceramic laminate 13 includes in-plane conductive patterns 14 to be formed into internal electrodes, internal leads, embedded elements, and other electrical elements in the ceramic multi-layered substrates, and separation patterns 17 arranged along boundaries (separation lines) between the ceramic multi-layered substrates, and provided between the stacked ceramic green sheets 12. Conductive via patterns 15 passing through the ceramic green sheets 12 and connected to the in-plane conductive patterns 14 are formed in the ceramic green sheets 12.

Figure 9:
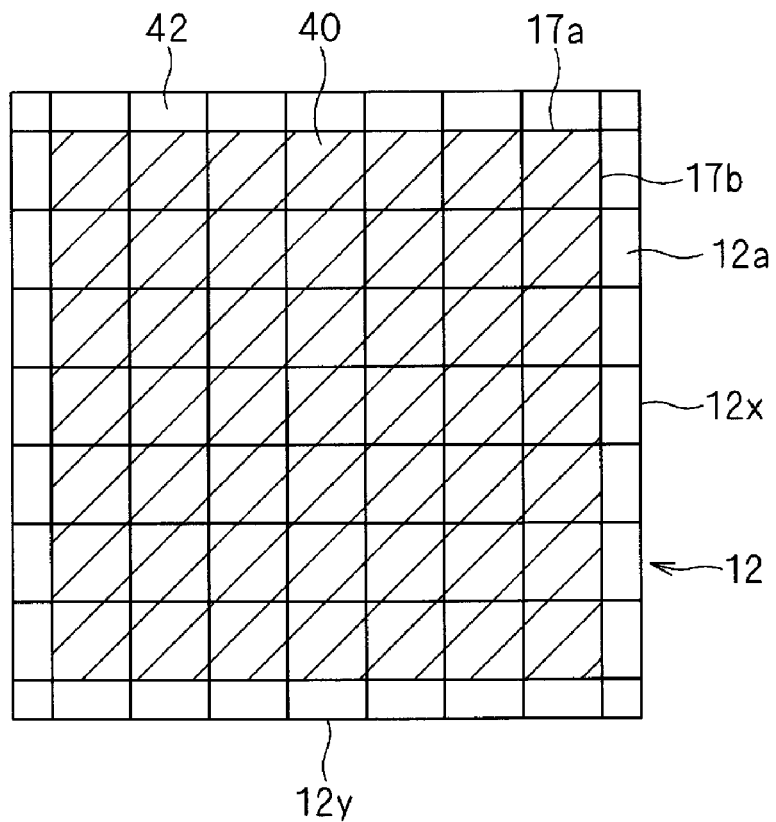
FIG. 9 is a plan view of a separation pattern according to the first preferred embodiment of the present invention.

The separation patterns 17 are primarily composed of a resin, such as a butyral resin, which disappear due to combustion, or a resin, such as an acrylic resin, which decomposes into a monomer at a high temperature. As shown in FIG. 9, in which main surfaces 12a of the ceramic green sheets 12 are viewed in the stacking direction, each of the separation patterns 17 includes segments 17a extending laterally and segments 17b extending longitudinally, the segments 17a being continuous with the segments 17b. Substantially rectangular portions 40 divided by the separation pattern segments 17a and 17b will be formed into ceramic multi-layered substrates. The portions 40 to be formed into the ceramic multi-layered substrates are arranged so as to be adjacent to each other in a shaded region. To maintain a substantially constant level of quality of the ceramic multi-layered substrates, margins 42, which are not to be formed into the ceramic multi-layered substrates, are arranged along outer edges 12x and 12y of the ceramic green sheets.

Figure 6:
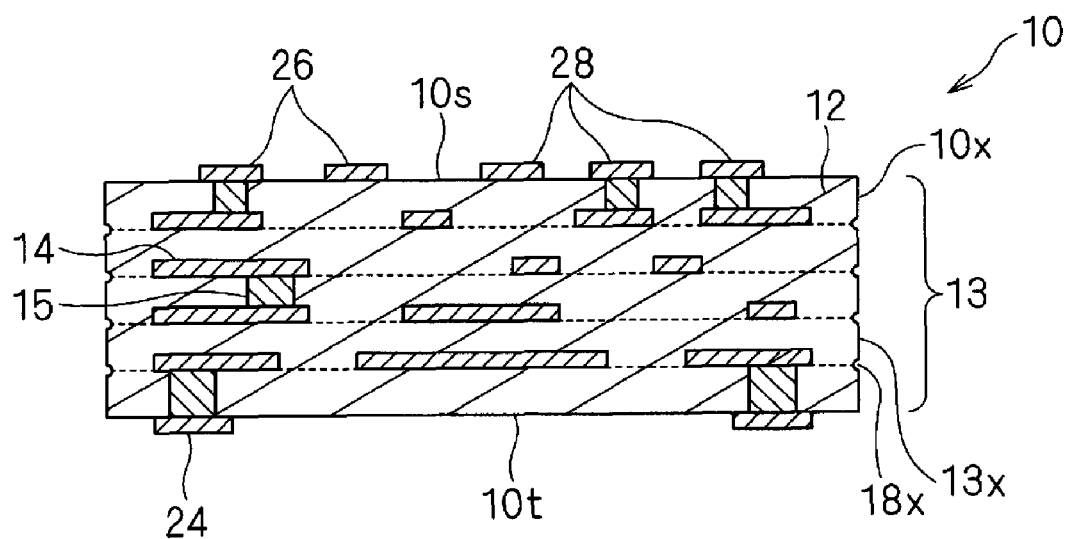
FIG. 6 is a cross-sectional view of the ceramic multi-layered substrate according to the first preferred embodiment of the present invention.

An in-plane conductive pattern 14k formed on a main surface of a ceramic green sheet 12k that is in close contact with a shrinkage inhibiting green sheet 20 shown in FIG. 1 will be formed into electrodes 26 and 28 exposed at one main surface 10s of a ceramic multi-layered substrate 10 as shown in FIG. 6.

As shown in FIG. 1, in-plane conductors 16 connected to conductive via patterns 15s in a ceramic green sheet 12s are formed on the shrinkage inhibiting green sheet 22. As shown in FIG. 6, the in-plane conductive pattern 16 will be formed into electrodes 24 exposed at the other main surface 10t of the ceramic multi-layered substrate 10.

Figure 3:
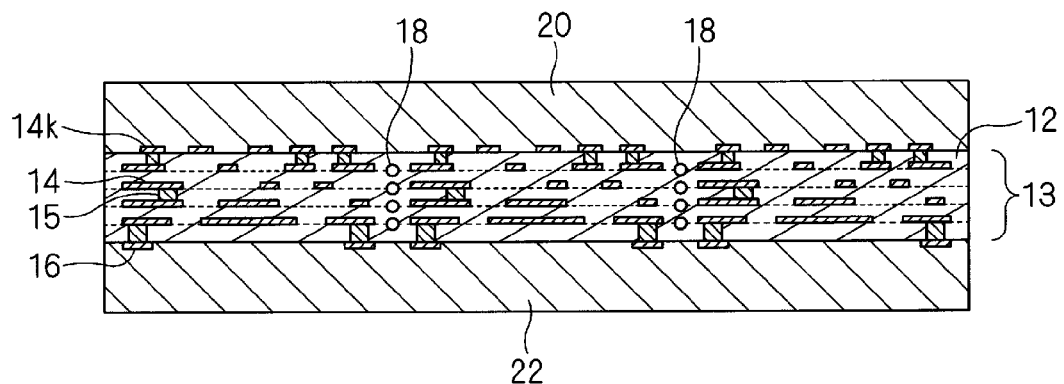
FIG. 3 is a cross-sectional view of a production process of the ceramic multi-layered substrates according to the first preferred embodiment of the present invention.

The composite laminate is fired under conditions in which the shrinkage inhibiting green sheets 20 and 22 are not sintered but the green ceramic laminate 13 is sintered. The green ceramic laminate 13 shrinks significantly in the thickness direction (vertical direction in the figure), e.g., a shrinkage of about 40% to about 60%, as shown in FIG. 3, because the shrinkage inhibiting green sheets 20 and 22 inhibit shrinkage in the planar direction. The separation lines 17 in the green ceramic laminate 13 disappear during firing to form cavities 18 at portions at which the separation lines 17 were present.

As shown in FIG. 9, the separation pattern segments 17a and 17b are continuously formed. Both ends of the segments 17a extend to the outer edges 12x, and both ends of the segments 17b extend to the outer edges 12y. Thus, the cavities 18 formed by the disappearance of the separation pattern segments 17a and 17b have openings at the side surfaces of the ceramic laminate 13 after firing. In this manner, when the separation pattern segments 17a are continuous with the separation pattern segments 17b and at least one end of the separation pattern segments 17a and 17b is exposed at a side surface of the green ceramic laminate 17, organic components in the ceramic green sheets 12 are eliminated through the cavities 18 formed by the disappearance of the separation pattern segments 17a and 17b. Thus, residual carbon is eliminated, and firing is efficiently performed.

The ceramic green sheets 12 include a binder resin. When the separation patterns 17 are primarily composed of a resin that disappears earlier than the binder resin during firing, the binder resin in the ceramic green sheets 12 is eliminated through the cavities 18 formed by the disappearance of the separation patterns 17, thereby performing firing even more efficiently.

Figure 4:
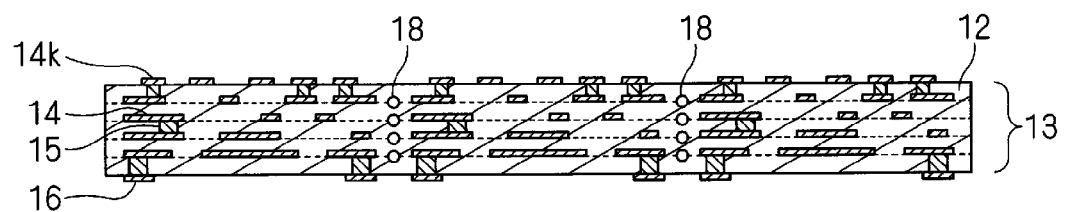
FIG. 4 is a cross-sectional view of a production process of the ceramic multi-layered substrates according to the first preferred embodiment of the present invention.

As shown in FIG. 4, the shrinkage inhibiting green sheets 20 and 22 are removed to obtain the sintered ceramic laminate 13.

Figure 5:
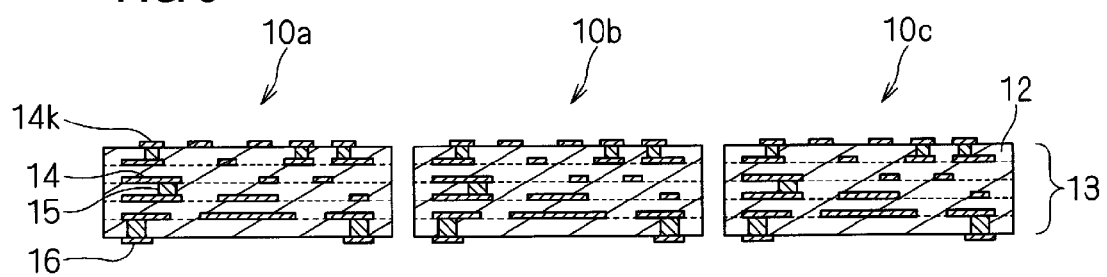
FIG. 5 is a cross-sectional view of the production process of the ceramic multi-layered substrates (first preferred embodiment).

The sintered ceramic laminate 13 is divided by bending into ceramic multi-layered substrates 10a, 10b, and 10c with sections passing through the cavities 18, as shown in FIG. 5.

Figure 7:
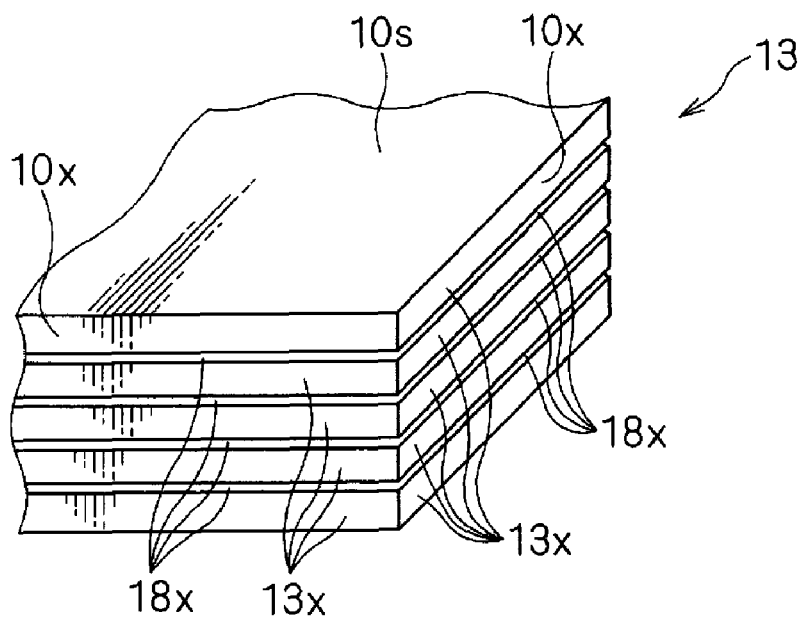
FIG. 7 is a perspective view of sections of the ceramic multi-layered substrate according to the first preferred embodiment of the present invention.

As shown in FIG. 6 and FIG. 7, cavity-separation portions 18x formed by dividing the cavities 18 and having a depressed shape and substantially flat ceramic-base-layer-break portions 13x are exposed at sections 10x of the ceramic substrate 10. For ceramic grains defining the ceramic base layers, only grain-boundary failure occurs at the cavity-separation portions 18x. Grain-boundary failure and intragranular failure occur at the ceramic-base-layer-break portions 13x.

To facilitate the initiation of separation, grooves may be formed in either or both main surfaces of the green ceramic laminate 13 along boundaries of portions to be formed into the ceramic multi-layered substrates. Alternatively, by forming a separation pattern between the ceramic base layer and the shrinkage inhibiting layer, a groove for facilitating the initiation of separation may be formed in a surface of the sintered ceramic laminate.

Figure 8:
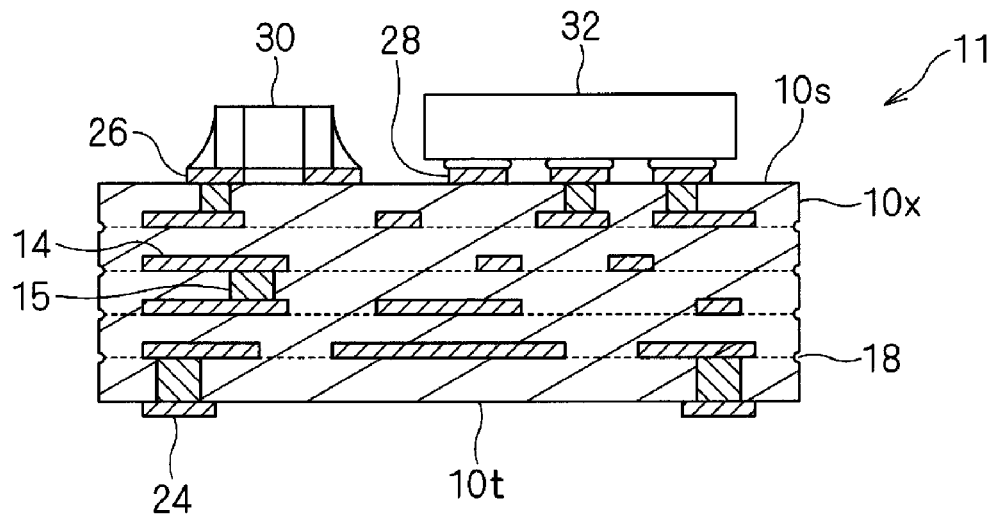
FIG. 8 is a cross-sectional view of a module including surface-mounted electronic components mounted on the ceramic multi-layered substrate according to the first preferred embodiment of the present invention.

As shown in FIG. 8, terminals of surface-mounted electronic components 30 and 32, such as a multilayer capacitor and an IC chip, are connected to the electrodes 26 and 28 exposed at one main surface of the ceramic multi-layered substrate 10, by solder reflow or by solder bumps, thereby forming a module 11 on which the surface-mounted electronic components 30 and 32 are mounted. The module 11 may be connected to an external circuit by connecting the electrodes 24 arranged on the other main surface of the ceramic multi-layered substrate 10 to the external circuit by solder reflow or other suitable method. As described above, the surface-mounted electronic components are preferably mounted on the source substrate prior to separation.

An example of the production of the ceramic multi-layered substrates will be described below.

Ceramic green sheets including ceramic materials are prepared.

Specifically, the ceramic green sheets are produced as follows: a mixture of about 50% to about 65% by weight of a glass powder having a composition of CaO (about 10% to about 55% by weight), $SiO_2$ (about 45% to about 70% by weight), $Al_2O_3$ (0% to about 30% by weight), impurities (0% to about 10% by weight), and $B_2O_3$ (0% to about 20% by weight) and about 35% to about 50% by weight of an $Al_2O_3$ powder including 0% to about 10% by weight impurities is dispersed in an organic vehicle including an organic solvent, a plasticizer, and other suitable ingredients to prepare a slurry. The resulting slurry is formed into sheets by a doctor blade method or casting. Thereby, green glass ceramic layers (ceramic green sheets) are produced.

The green glass ceramic layers are preferably ceramic green sheets formed by the above-described sheet-forming method. Alternatively, the green glass ceramic layers may be green thick printed layers. With respect to the ceramic powder, a magnetic material, such as ferrite, and a dielectric material, such as barium titanate, may be used in addition to the above-described insulating material. As the ceramic green sheets, low-temperature co-fired ceramic green sheets that are sintered at about 1,050° C. or less are preferably provided. Thus, the above-described glass powder has a softening point of about 750° C. or less.

Through holes are formed in the green glass ceramic layers by punching or other suitable method. A conductive paste including a conductive material is filled into the through holes. Examples of a method for forming the in-plane conductive patterns 14 include a method in which a conductive paste is applied by screen printing, gravure printing, or other suitable method, and a method in which metal foil having a predetermined shape is transferred.

As the conductive material, a material primarily composed of Ag having low resistivity and oxidation resistance is preferable used. In particular, when an increased bonding strength to a ceramic material is required, at least one additive, such as $Al_2O_3$, may be included in addition to Ag as a main component.

The conductive paste may be produced by adding a predetermined proportion of an organic vehicle to the above-described main component powder, and stirring and kneading the mixture. However, the sequence of mixing the main component powder, the additive powder, and the organic vehicle is not particularly limited.

The organic vehicle is a mixture of a binder resin and a solvent. Examples of the binder resin that can be used include ethyl cellulose, acrylic resins, polyvinyl butyral, and methacrylic resins.

Examples of the solvent that can be used include terpineol, dihydroterpineol, dihydroterpineol acetate, butyl carbitol, butyl carbitol acetate, and alcohols.

As necessary, various dispersants, plasticizers, and activators may be included.

The conductive paste preferably has a viscosity of about 50 Pa·s to about 700 Pa·s so as to maintain printability.

The conductive patterns arranged on the surface include portions at which the conductive via patterns 15, such as via-hole conductors and through-hole conductors, for connecting conductive patterns arranged at different interfaces between the layers are exposed at the surface. The conductive via patterns 15 are formed by filling the above-described paste into the through holes. The through holes are formed in the glass ceramic green sheets by punching, printing or other suitable method.

A paste for forming the separation patterns 17 may include the organic vehicle included in the above-described conductive paste and is also applied to the ceramic green sheets by printing, for example.

The shrinkage inhibiting green sheets are produced as follows: a ceramic material powder, such as alumina, which is not substantially sintered at a firing temperature of the above-described green glass ceramic layers, is dispersed in an organic vehicle including an organic binder, an organic solvent, a plasticizer, and other suitable ingredients to prepare a slurry. The slurry is formed into sheets by a doctor blade method or casting. Thereby, the shrinkage inhibiting green sheets are produced. The shrinkage inhibiting green sheets are sintered at, for example, about 1,400° C. to about 1,600° C., and thus, are not substantially sintered at the firing temperature of the green glass ceramic layers.

Each of the shrinkage inhibiting green sheets may have a single-layer structure or a structure including a plurality of stacked layers. The ceramic powder used for the shrinkage inhibiting green sheets preferably has an average particle size of about 0.1 µm to about 5.0 µm. When the ceramic powder has an average particle size of less than about 0.1 µm, the powder vigorously reacts with the glass components included in the vicinity of surfaces of the green glass ceramic layers. Thus, in some cases, the glass ceramic layers are bonded to the shrinkage inhibiting green sheets after firing. As a result, the shrinkage inhibiting green sheets cannot be removed. Furthermore, delamination may occur in the substrate because the organic components, such as the binder, in the sheets are not easily eliminated due to such a small particle size. On the other hand, the ceramic powder having an average particle size greater than about 5.0 µm is less effective in inhibiting firing shrinkage, thereby the substrate is prone to shrink unnecessarily in the x and y directions or to warp.

The ceramic powder defining the shrinkage inhibiting green sheets may be a ceramic powder that is not substantially sintered at the firing temperature of the green glass ceramic layers. Ceramic powders, such as zirconia and magnesia, may be used instead of alumina. However, to increase the amount of the glass components in surface regions of the green glass ceramic layers, the glass components in the surfaces must have good wettability for the shrinkage inhibiting green sheets at interfaces at which the surfaces are in contact with the shrinkage inhibiting green sheets. Thus, the same ceramic powder as the ceramic powder defining the green glass ceramic layers is preferably used.

The ceramic green sheets including the in-plane conductive patterns, the conductive via patterns, and boundary-arrangement-conductive patterns are stacked to form a green ceramic laminate. A composite laminate including the shrinkage inhibiting green sheets arranged on both main surfaces of the ceramic laminate is produced by superposing the shrinkage inhibiting green sheets on both main surfaces of the green ceramic laminate and press-bonding the resulting article by isostatic pressing at a pressure of, for example, about 5 MPa to about 200 MPa.

Preferably, each of the shrinkage inhibiting green sheets has a thickness of about 25 µm to about 500 µm, for example. Shrinkage inhibiting green sheets having a thickness of less than about 25 µm are much less effective in inhibiting firing shrinkage, thereby allowing the substrate to shrink unnecessarily in the x and y directions or to warp. At a thickness greater than about 500 µm, delamination is likely to occur in the substrate because the organic components, such as the binder, in the sheets are not easily eliminated.

The composite laminate is fired in a known belt furnace or a batch furnace at a firing temperature, e.g., about 850° C. to about 950° C., of the ceramic green sheets of the green ceramic laminate to sinter the green ceramic laminate. In this case, the green ceramic laminate shrinks significantly in the thickness direction but does not substantially shrink in the planar direction due to the shrinkage inhibiting green sheets.

The shrinkage inhibiting green sheets are removed from the composite laminate after firing to obtain the sintered ceramic laminate including portions to be formed into the plurality of ceramic multi-layered substrates.

In the sintered composite laminate, the shrinkage inhibiting green sheets are not substantially sintered. The organic components included therein before firing are eliminated. As a result, the shrinkage inhibiting green sheets become porous. Thus, the shrinkage inhibiting green sheets can be easily removed by sand blasting, wet blasting, a supersonic vibration technique, or other suitable method.

The sintered ceramic laminate obtained by removing the shrinkage inhibiting green sheets is divided along the boundaries between the ceramic multi-layered substrates into the ceramic multi-layered substrates.

When the sintered ceramic laminate is divided after firing, the stress concentration occurs in the vicinity of the cavities formed along the boundaries between the ceramic multi-layered substrates to form cracks, which results in the ceramic multi-layered substrates each having desired dimensions and smooth sections. The sections may be further smoothed by a smoothing process, such as barrel polishing.

First Modification of First Preferred Embodiment

Figure 10:
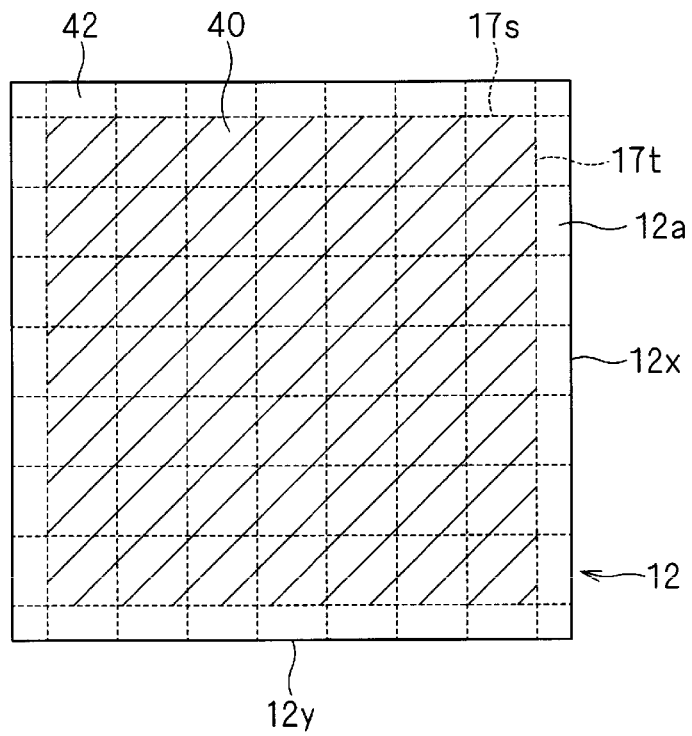
FIG. 10 is a plan view of a separation pattern according to a modification of the first preferred embodiment of the present invention.

As shown in FIG. 10, when the main surfaces 12a of the ceramic green sheets 12 are viewed in the stacking direction, separation pattern segments 17s extending laterally and separation pattern segments 17t extending longitudinally are formed in a lattice configuration as in the first preferred embodiment, except that each of the separation pattern segments 17s and 17t is discontinuously formed so as to be a dashed line.

Second Modification of First Preferred Embodiment

Figure 11:
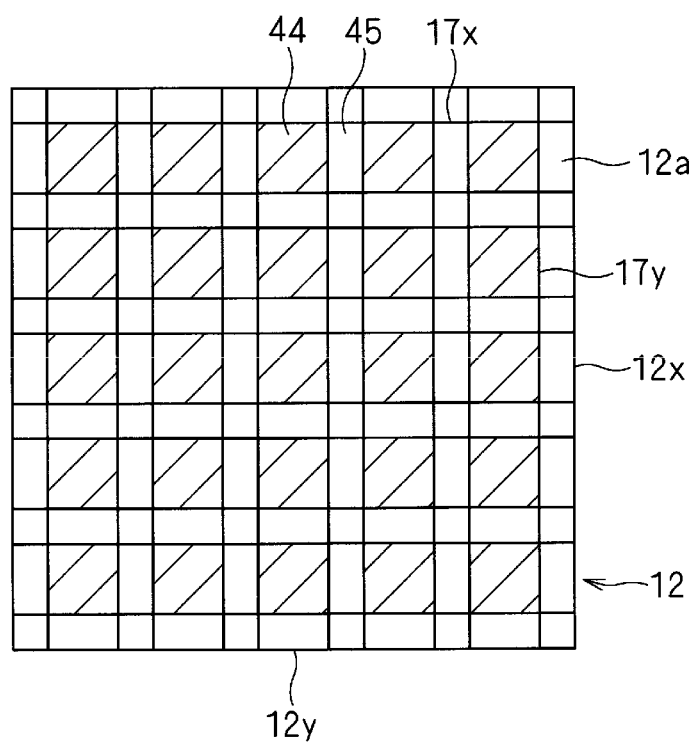
FIG. 11 a plan view of a separation pattern according to another modification of the first preferred embodiment of the present invention.

As shown in FIG. 11 when the main surfaces 12a of the ceramic green sheets 12 are viewed in the stacking direction, separation pattern segments 17x extending laterally and separation pattern segments 17y extending longitudinally are formed in a lattice configuration. Blank spaces 45 which will not be formed into the ceramic multi-layered substrates are arranged between adjacent shaded portions 44 to be formed into the ceramic multi-layered substrates. Terminals for inspecting the ceramic multi-layered substrates before separation may be provided in the blank spaces 45.

Third Modification of First Preferred Embodiment

Figure 12:
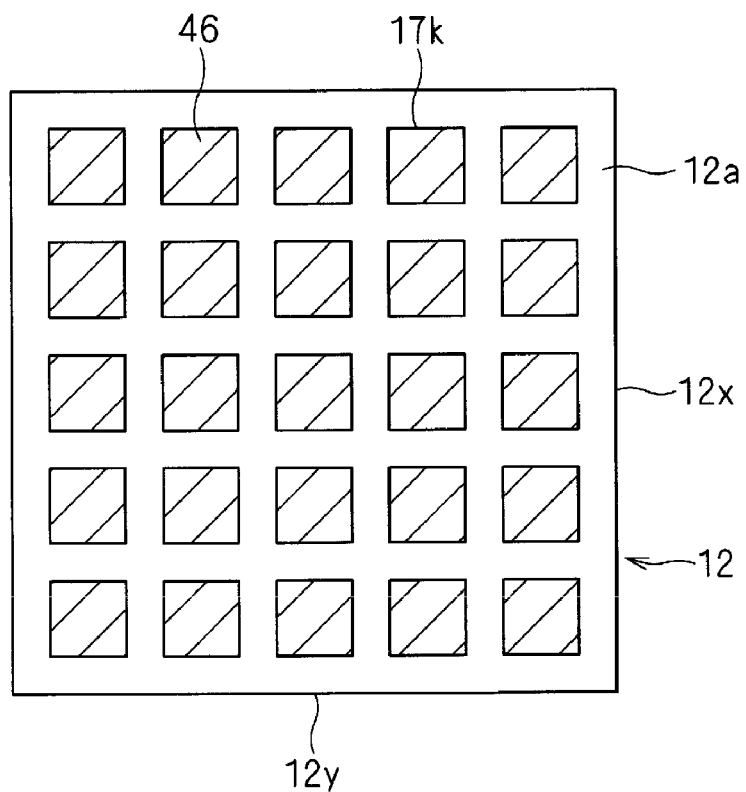
FIG. 12 a plan view of a separation pattern according to yet another modification of the first preferred embodiment of the present invention.

As shown in FIG. 12 when the main surfaces 12a of the ceramic green sheets 12 are viewed in the stacking direction, separation pattern 17k are formed only along boundaries of shaded portions 46 to be formed into the ceramic multi-layered substrates. In the first preferred embodiment and the first and second modifications of the first preferred embodiment, the ceramic multi-layered substrates are obtained by longitudinal and lateral separation. In the third modification of the first preferred embodiment, the ceramic multi-layered substrates are obtained by simply punching the portions 46 to be formed into the ceramic multi-layered substrates.

Second Preferred Embodiment

A method for manufacturing a ceramic multi-layered substrate according to a second preferred embodiment will be described below with reference to FIGS. 13 to 18. The method for manufacturing a ceramic multi-layered substrate according to the second preferred embodiment is substantially the same as in the first preferred embodiment. Points of difference from the first preferred embodiment will be described below. The same elements as those in the first preferred embodiment are designated using the same reference numerals, and descriptions thereof are omitted.

In the second preferred embodiment, ceramic multi-layered substrates are produced by the same method as that in the first preferred embodiment, except that separation patterns 17x which are formed between the ceramic green sheets 12 and arranged along boundaries (separation lines) between the ceramic multi-layered substrates are composed of a special material.

Figure 13:
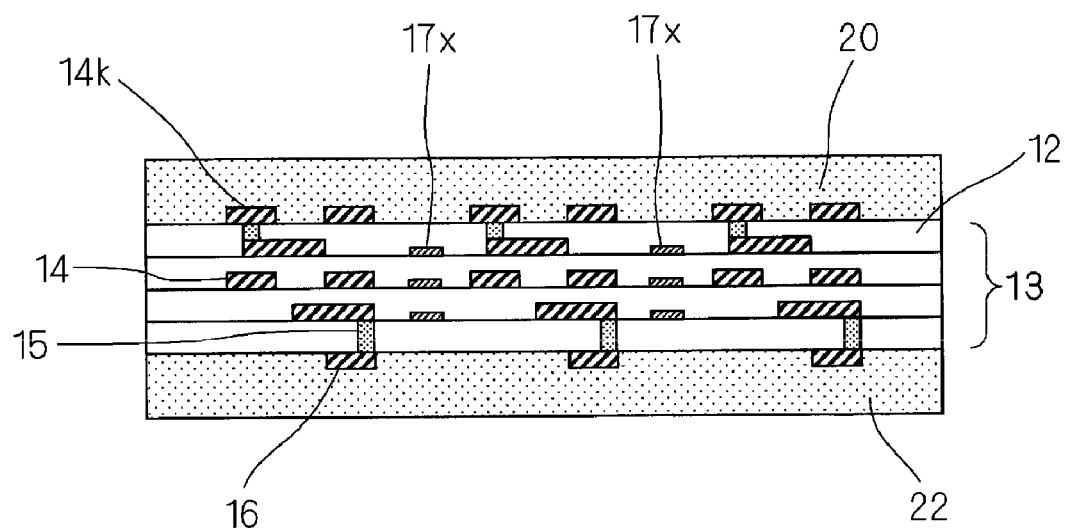
FIG. 13 is a cross-sectional view of a production process of ceramic multi-layered substrates according to a second preferred embodiment of the present invention.

As shown in FIG. 13, the plurality of ceramic green sheets 12 and the shrinkage inhibiting green sheets 20 and 22 are prepared and stacked in a predetermined order to form a composite laminate in which the shrinkage inhibiting green sheets 20 and 22 are in close contact with both surfaces of a green ceramic laminate 12.

Before stacking, the ceramic green sheets 12 include in-plane conductive patterns 14 to be formed into internal electrodes, internal leads, embedded elements, and other suitable electrical elements and separation patterns 17x arranged along the boundaries (separation lines) between the ceramic multi-layered substrates, as in the first preferred embodiment shown in FIG. 1. The conductive via patterns 15 passing through the ceramic green sheets 12 and connected to the in-plane conductive patterns 14 are formed. The in-plane conductive pattern 14k is formed on a main surface of the ceramic green sheet in close contact with the shrinkage inhibiting green sheet 20. The in-plane conductors 16 connected to conductive via patterns in the ceramic green sheet are formed on the shrinkage inhibiting green sheet 22.

In the second preferred embodiment, in particular, the separation patterns 17x include a material powder that disappears at approximately the maximum firing temperature of the ceramic green sheets during the firing of the ceramic laminate. For example, the material powder is composed of carbon.

Figure 14:
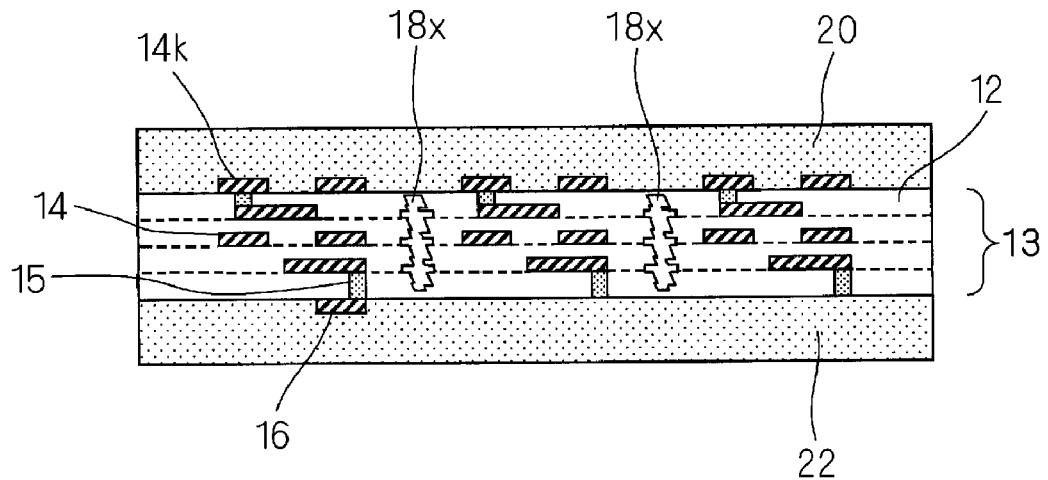
FIG. 14 is a cross-sectional view of a production process of the ceramic multi-layered substrates according to the second preferred embodiment of the present invention.

A composite laminate is fired under conditions in which the shrinkage inhibiting green sheets 20 and 22 are not sintered but the green ceramic laminate 13 is sintered. The green ceramic laminate 13 shrinks significantly in the thickness direction (vertical direction in the figure), e.g., a shrinkage of about 40% to about 60% during the firing, as shown in FIG. 14 which is a cross-sectional view, because the shrinkage inhibiting green sheets 20 and 22 inhibit the shrinkage in the planar direction. The separation lines 17x in the green ceramic laminate 13 disappear by firing to form cavities 18x at portions at which the separation lines 17x were provided.

In the second preferred embodiment, in particular, the large cavities 18x are formed after firing. Thus, adjacent cavities 18x are easily connected to each other.

If the separation patterns disappear in the course of the shrinkage of the ceramic green sheets by firing, cavities formed after the disappearance of the separation patterns are reduced in size due to the shrinkage of the ceramic green sheets or the entry of the glass components in the ceramic green sheets into the cavities during the subsequent firing. In some cases, the cavities are eliminated. When the cavities are formed at a later stage of firing, the size of the cavities is not significantly reduced. The separation patterns 17x in the second preferred embodiment includes the material powder that disappears at approximately the maximum firing temperature, thus forming the large cavities after firing.

When the separation patterns 17x disappear to form the cavities 18x, ceramic green sheet portions between adjacent separation patterns 17x in the stacking direction (z-direction) also shrink in the planar direction (x- and y-directions). Meanwhile, in the ceramic green sheets around the portions, restraint layers continue to inhibit the shrinkage in the planar direction. Thus, when the separation patterns 17x disappear to form the cavities 18x, cracks extending in the stacking direction form in the ceramic green sheet portions between adjacent separation patterns 17x in the stacking direction. As a result, the cavities 18x are connected.

Figure 15:
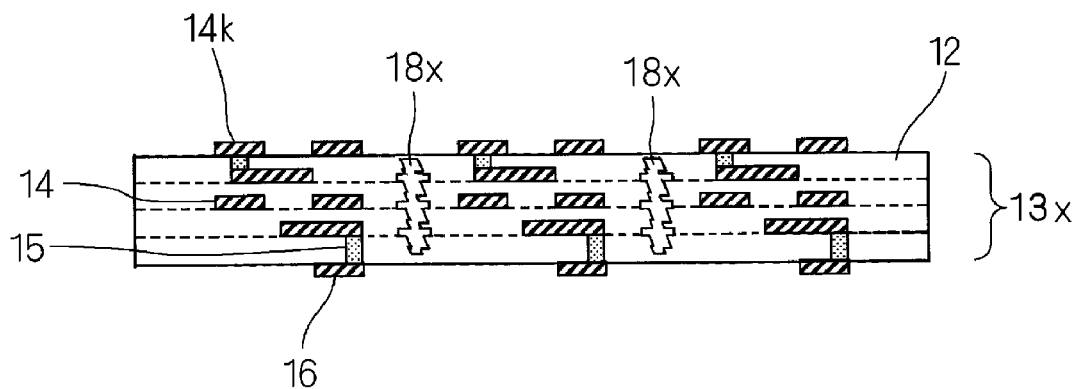
FIG. 15 is a cross-sectional view of a production process of the ceramic multi-layered substrates according to the second preferred embodiment of the present invention.

As shown in FIG. 15, the shrinkage inhibiting green sheets 20 and 22 are removed to obtain the sintered ceramic laminate 13x. For example, the outermost ceramic green sheets each having a thickness such that the cracks do not extend to the outermost ceramic green sheets (the cavities are not connected) facilitate handling, e.g., conveyance, of the sintered ceramic laminate 13x.

Figure 16:
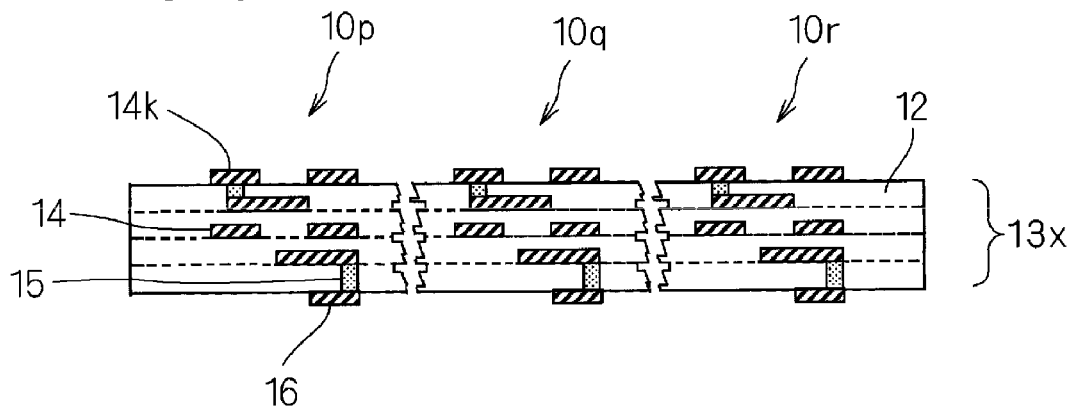
FIG. 16 is a cross-sectional view of a production process of the ceramic multi-layered substrates according to the second preferred embodiment of the present invention.

The sintered ceramic laminate 13x is separated by bending into ceramic multi-layered substrates 10p, 10q, and 10r, as shown in FIG. 16. In this case, the laminate is easily divided because the cavities are connected to each other. Furthermore, the laminate is not divided in an inappropriate direction or location.

Figure 17:
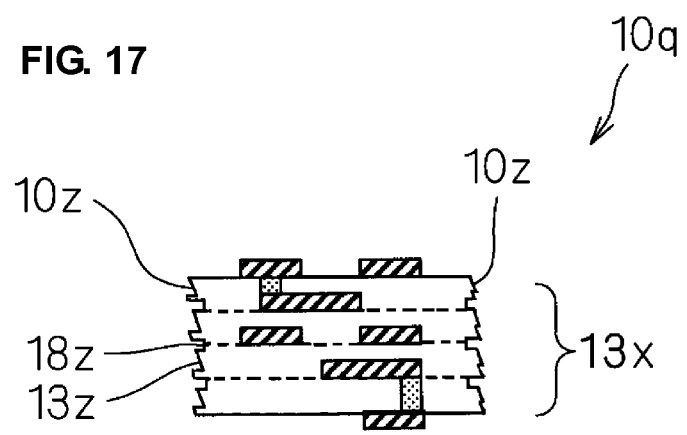
FIG. 17 is a cross-sectional view of the production process of the ceramic multi-layered substrates according to the second preferred embodiment of the present invention.

As shown in FIG. 17, cavity-separation portions 18z formed by dividing the cavities 18x and having a depressed shape and substantially flat ceramic-base-layer-break portions 13z formed by breakage of the ceramic base layers are exposed at sections 10z of the ceramic multi-layered substrate 10q.

An example of the production of the ceramic multi-layered substrates will be described below. The production method in the second preferred embodiment is different from the production method in the first preferred embodiment in only the paste used for forming the separation patterns 17x.

Ceramic green sheets including ceramic materials are prepared.

The ceramic green sheets are produced as follows: a mixture of about 50% to about 65% by weight of a glass powder having a composition of CaO (about 10% to about 55% by weight), $SiO_2$ (about 45% to about 70% by weight), $Al_2O_3$ (0% to about 30% by weight), impurities (0% to about 10% by weight), and $B_2O_3$ (0% to about 20% by weight) and about 35% to about 50% by weight of an $Al_2O_3$ powder including 0% to about 10% by weight impurities is dispersed in an organic vehicle including an organic solvent, a plasticizer, and other suitable ingredients to prepare a slurry. The slurry is formed into sheets by a doctor blade method or casting. Thereby, green glass ceramic layers (ceramic green sheets) are produced.

The green glass ceramic layers are preferably ceramic green sheets formed by the above-described sheet-forming method. Alternatively, the green glass ceramic layers may be green thick printed layers. With respect to the ceramic powder, a magnetic material, such as ferrite, and a dielectric material, such as barium titanate, may be used as the above-described insulating material. As the ceramic green sheets, low-temperature co-fired ceramic green sheets that are sintered at about 1,050° C. or less are preferably used. Thus, the above-described glass powder has a softening point of about 750° C. or less.

Through holes are formed in the green glass ceramic layers by punching or other suitable method. A conductive paste including a conductive material is filled into the through holes. Examples of a method for forming the in-plane conductive patterns 14 include a method in which a conductive paste is applied by screen printing, gravure printing, or other suitable method, and a method in which metal foil having a predetermined shape is transferred.

As the conductive material, a material primarily composed of Ag having low resistivity and oxidation resistance is preferably used. In particular, when an increased bonding strength to a ceramic material is required, at least one additive, such as $Al_2O_3$, may be incorporated in addition to Ag as a main component.

The conductive paste may be produced by adding a predetermined proportion of an organic vehicle to the above-described the main component powder, and stirring and kneading the mixture. However, the sequence of mixing the main component powder, the additive powder, the organic vehicle, and other ingredients is not particularly limited.

The organic vehicle is a mixture of a binder resin and a solvent. Examples of the binder resin that can be used include ethyl cellulose, acrylic resins, polyvinyl butyral, and methacrylic resins.

Examples of the solvent that can be used include terpineol, dihydroterpineol, dihydroterpineol acetate, butyl carbitol, butyl carbitol acetate, and alcohols.

As necessary, various dispersants, plasticizers, activators may be incorporated.

The conductive paste preferably has a viscosity of about 50 Pa·s to about 700 Pa·s to maintain printability.

The conductive patterns arranged on the surface includes portions at which the conductive via patterns 15, such as via-hole conductors and through-hole conductors, for connection of conductive patterns arranged at different interfaces among the layers are exposed at the surface. The conductive via patterns 15 are formed by filling the above-described paste into the through holes, which are formed in the glass ceramic green sheets by punching, printing or other suitable method.

A paste for forming the separation patterns 17x is formed by adding the organic vehicle included in the above-described conductive paste to a carbon powder and kneading the mixture. The paste is applied to the ceramic green sheets by printing.

The shrinkage inhibiting green sheets are produced as follows: a ceramic material powder, such as alumina, which is not substantially sintered at a firing temperature of the above-described green glass ceramic layers, is dispersed in an organic vehicle including an organic binder, an organic solvent, a plasticizer, and other suitable ingredients to prepare a slurry. The slurry is formed into sheets by a doctor blade method or casting. Thereby, the shrinkage inhibiting green sheets are produced. The shrinkage inhibiting green sheets are sintered at, for example, about 1,400° C. to about 1,600° C., and thus, are not substantially sintered at the firing temperature of the green glass ceramic layers.

Each of the shrinkage inhibiting green sheets may have a single-layer structure or a structure including a plurality of stacked layers. The ceramic powder used for the shrinkage inhibiting green sheets preferably has an average particle size of about 0.1 μm to about 5.0 μm, for example. When the ceramic powder has an average particle size of less than about 0.1 μm, the powder reacts vigorously with the glass components included in the vicinity of surfaces of the green glass ceramic layers. Thus, in some cases, the glass ceramic layers are bonded to the shrinkage inhibiting green sheets after firing. As a result, the shrinkage inhibiting green sheets cannot be removed. Furthermore, delamination may occur in the substrate because the organic components, such as the binder, in the sheets are not easily eliminated due to such a small particle size. On the other hand, the ceramic powder having an average particle size greater than about 5.0 μm tends to have a reduced shrinkage inhibiting power, thereby causing the substrate to shrink unnecessarily in the x and y directions or to warp.

The ceramic powder defining the shrinkage inhibiting green sheets may be a ceramic powder that is not substantially sintered at the firing temperature of the green glass ceramic layers. Ceramic powders such as zirconia and magnesia may be used instead of alumina. However, to increase the amount of the glass components in surface regions of the green glass ceramic layers, the glass components in the surfaces must have good wettability for the shrinkage inhibiting green sheets at interfaces at which the surfaces are in contact with the shrinkage inhibiting green sheets. Thus, the same ceramic powder as the ceramic powder defining the green glass ceramic layers is preferably used.

The ceramic green sheets including the in-plane conductive patterns, the conductive via patterns, and boundary-arrangement-conductive patterns are stacked to form a green ceramic laminate. A composite laminate including the shrinkage inhibiting green sheets arranged on both main surfaces of the ceramic laminate is produced by superposing the shrinkage inhibiting green sheets on both main surfaces of the green ceramic laminate and press-bonding the resulting article by isostatic pressing at a pressure of, for example, about 5 MPa to about 200 MPa.

Preferably, each of the shrinkage inhibiting green sheets has a thickness of about 25 μm to 500 μm, for example. The shrinkage inhibiting green sheets having a thickness of less than about 25 μm have a reduced shrinkage inhibiting power, thereby allowing the substrate to shrink unnecessarily in the x and y directions or to warp. At a thickness greater than about 500 μm, delamination tends to occur in the substrate because the organic components, such as the binder, in the sheets are not easily eliminated.

The composite laminate is fired in a known belt furnace or a batch furnace at a firing temperature, e.g., about 850° C. to about 950° C., of the ceramic green sheets of the green ceramic laminate to sinter the green ceramic laminate. In this case, the green ceramic laminate shrinks significantly in the thickness direction but does not substantially shrink in the planar direction due to the shrinkage inhibiting green sheets.

The shrinkage inhibiting green sheets are removed from the composite laminate after firing to obtain the sintered ceramic laminate including portions to be formed into the plurality of ceramic multi-layered substrates.

In the sintered composite laminate, the shrinkage inhibiting green sheets are not substantially sintered. The organic components included therein before firing are eliminated. As a result, the shrinkage inhibiting green sheets become porous. Thus, the shrinkage inhibiting green sheets can be easily removed by sand blasting, wet blasting, a supersonic vibration technique, or other suitable method.

The sintered ceramic laminate obtained by removing the shrinkage inhibiting green sheets is divided along the boundaries between the ceramic multi-layered substrates into the ceramic multi-layered substrates.

When the sintered ceramic laminate is divided, a stress is applied in the vicinity of the cavities formed along the boundaries between the ceramic multi-layered substrates to form cracks, which results in the ceramic multi-layered substrates each having desired dimensions and smooth sections.

Figure 18:
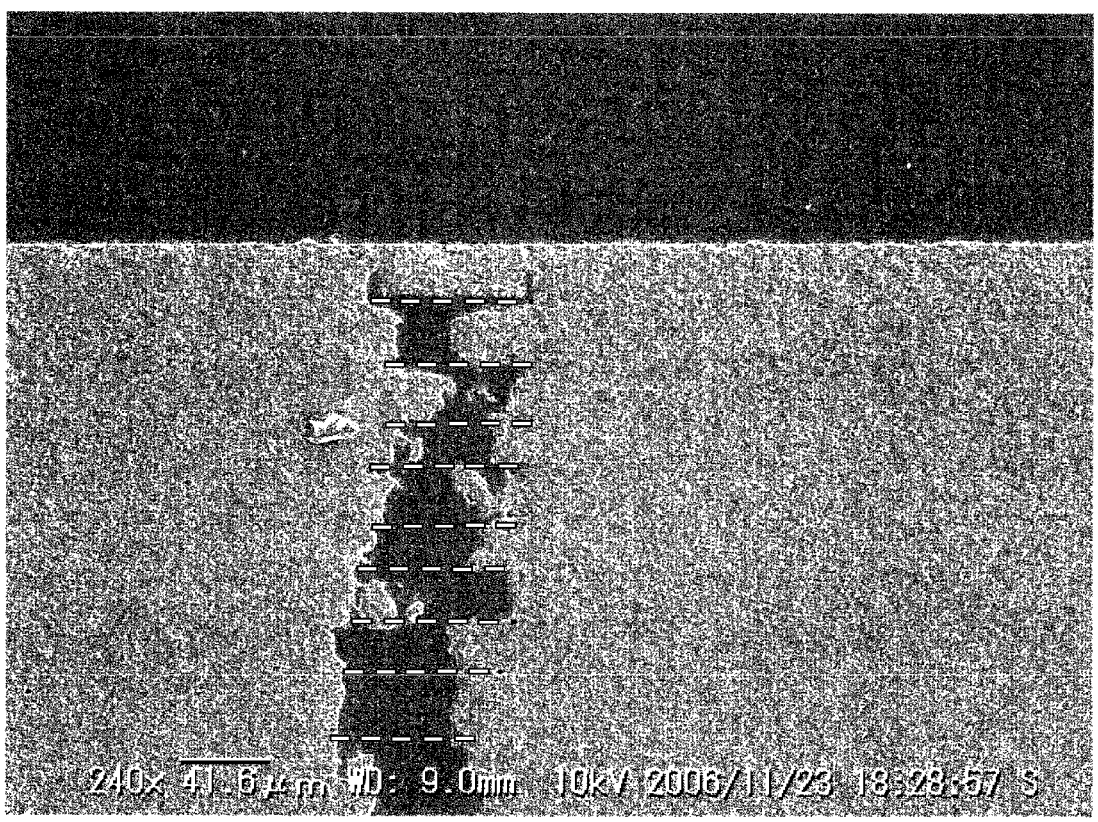
FIG. 18 is a photograph of a separation portion of the ceramic multi-layered substrates according to the second preferred embodiment of the present invention.

FIG. 18 is a photograph of the outermost layer of the ceramic multi-layered substrates and the periphery thereof before the ceramic multi-layered substrates are obtained by separation, according to the production method in the second preferred embodiment. Portions indicated by dotted lines are portions of the separation lines formed by printing. The photograph demonstrates that the cavity extends along the boundaries of the ceramic multi-layered substrates and across the plurality of layers except the outermost layer. The separation lines each have a width of about 50 μm. The resulting cavity has substantially the same width. A smaller width of each separation line produces a cavity having a reduced width.

The production method according to the second preferred embodiment described above is suitably used when the ceramic multi-layered substrates are produced accurately and easily by forming the separation patterns on the ceramic green sheets by printing, and separating the ceramic substrates from the sintered ceramic laminate by utilizing the cavities formed by the disappearance of the separation patterns during firing.

That is, the formation of the separation lines composed of an organic compound on the ceramic green sheets may result in a reduction in the size of the cavities during firing or the elimination of the cavities. In particular, in glass-ceramic green sheets used to control firing behavior by utilizing the viscous flow of glass, when each of the organic separation lines has a reduced width, the reduction or elimination of the cavities tends to occur to a greater extent. When the cavities are reduced in size or eliminated, separation cannot be achieved at desired sections when the substrates are obtained by separation after firing, thereby easily causing defects.

The formation of the separation lines composed of carbon, which is an inorganic substance, increases a temperature at which the separation lines disappear by firing to approximately the maximum temperature when the substrates are fired. This prevents the elimination of the cavities due to the viscous flow of glass in the ceramic green sheets.

When the cavities are formed between the ceramic green sheets, in which the shrinkage is inhibited in the planar direction (x- and y-direction) by the restraint layers, due to the disappearance of the separation lines during firing, portions adjacent to the cavities are not restrained, and thus, can shrink in the planar direction (x- and y-direction). Accordingly, the ceramic green sheets shrink in the planar direction (x- and y-direction) in only minute regions between the cavities, thereby forming cracks in the minute regions. The cavities communicate with one another through the cracks. Thus, the separation after firing is easily performed to obtain the ceramic multi-layered substrates. Furthermore, the separation does not occur in an undesired direction.

With respect to a material included in the separation lines, carbon is preferable because it is inexpensive and does not adversely affect the ceramic multi-layered substrate when it disappears. Alternatively, another material, such as an inorganic material other than carbon or an organic material, may be used as long as it disappears at approximately the maximum firing temperature of the ceramic green sheets during firing.

As described above, the separation patterns are formed on the ceramic green sheets by printing, and the ceramic substrates are separated from the sintered ceramic laminate by utilizing the cavities formed by the disappearance of the separation patterns during firing. Thereby, the ceramic multi-layered substrates are accurately and easily produced.

The ceramic laminate after firing can be cut by bending. This eliminates the need to process the ceramic laminate with a special cutting apparatus for cutting the hard ceramic laminate after firing (e.g., a laser beam machine, a dicing saw, or other suitable cutting apparatus), thereby simplifying the process.

The present invention is not limited to the above-described preferred embodiments. Various changes can be made without departing from the scope of the present invention.

For example, preferred embodiments of the present invention can be applied to the production of a ceramic multi-layered substrate for use in a device (single-function component) in which another component is not mounted on the ceramic multi-layered substrate, e.g., a multilayer capacitor, a multilayer inductor, an LC chip, or other suitable component, as well as the production of a ceramic multi-layered substrate for use in a module (combined functional component) on which a surface-mounted electronic component is mounted.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A method for manufacturing a ceramic multi-layered substrate, comprising:
    a first step of forming a green ceramic laminate including a plurality of stacked green ceramic base layers that are stacked on each other in a stacking direction and a separation pattern located between at least two of the plurality of green ceramic base layers that are directly adjacent to and stacked on each other in the stacking direction;
    a second step of firing the green ceramic laminate to sinter the green ceramic layers and to cause the separation pattern to disappear and form at least one cavity inside the sintered ceramic laminate; and
    a third step of separating the sintered ceramic laminate through the at least one cavity into a plurality of ceramic multi-layered substrates; wherein
    the separation pattern is located only along separation lines defining boundary lines used when separating the laminate into the ceramic multi-layered substrates.

2. The method for manufacturing a ceramic multi-layered substrate according to claim 1, wherein a shrinkage inhibiting layer arranged to inhibit the firing shrinkage of the green ceramic base layers in the planar direction is provided on a main surface of at least one of the green ceramic base layers.

3. The method for manufacturing a ceramic multi-layered substrate according to claim 2, wherein the shrinkage inhibiting layer is composed of a ceramic material that is not substantially sintered during the firing in the second step.

4. The method for manufacturing a ceramic multi-layered substrate according to claim 2, wherein the shrinkage inhibiting layer is provided on at least one main surface of the green ceramic laminate, and the shrinkage inhibiting layer is removed after firing.

5. The method for manufacturing a ceramic multi-layered substrate according to claim 1, wherein the separation pattern is a resin pattern primarily composed of a resin that disappears during the firing.

6. The method for manufacturing a ceramic multi-layered substrate according to claim 1, wherein the separation pattern is composed of a paste including a material powder that disappears after a temperature in the second step reaches approximately the maximum firing temperature.

7. The method for manufacturing a ceramic multi-layered substrate according to claim 6, wherein the material powder is composed of carbon.

8. The method for manufacturing a ceramic multi-layered substrate according to claim 1, wherein at least one end of the separation pattern is exposed at a side surface of the green ceramic laminate.

9. The method for manufacturing a ceramic multi-layered substrate according to claim 8, wherein each of the green ceramic base layers includes a binder resin, and the separation pattern is primarily composed of a resin that disappears earlier than the binder resin disappears during the firing.

10. The method for manufacturing a ceramic multi-layered substrate according to claim 9, wherein the separation pattern has a lattice shape so as to define the plurality of ceramic multi-layered substrates.

11. The method for manufacturing a ceramic multi-layered substrate according to claim 10, wherein one separation pattern segment is arranged between adjacent ones of the plurality of ceramic multi-layered substrates.

12. The method for manufacturing a ceramic multi-layered substrate according to claim 10, wherein at least two separation pattern segments are arranged between the adjacent ones of the plurality of ceramic multi-layered substrates.

13. The method for manufacturing a ceramic multi-layered substrate according to claim 1, wherein the green ceramic base layers are green low-temperature co-fired ceramic layers primarily composed of a low-temperature co-fired ceramic powder, and the green ceramic laminate includes a conductive pattern primarily composed of one of gold, silver, and copper.

14. The method for manufacturing a ceramic multi-layered substrate according to claim 1, further comprising a step of mounting a surface-mounted electronic component on a portion corresponding to one of the plurality of the ceramic multi-layered substrates of the sintered ceramic laminate or at least one main surface of the one of the plurality of ceramic multi-layered substrates separated from the sintered ceramic laminate.

* * * * *